United States Patent [19]

Suzuki

[11] 4,021,746

[45] May 3, 1977

[54] TRANSISTOR AMPLIFIER HAVING FIELD EFFECT TRANSISTORS WITH STABILIZED DRAIN BIAS CURRENT

[75] Inventor: Tadao Suzuki, Tokyo, Japan

[73] Assignee: Sony Corporation, Tokyo, Japan

[22] Filed: Nov. 10, 1975

[21] Appl. No.: 630,330

[30] Foreign Application Priority Data

Nov. 15, 1974 Japan ............................ 49-131686

[52] U.S. Cl. .................................. 330/13; 330/22; 330/24; 330/30 D; 330/35
[51] Int. Cl.[2] ......................................... H03F 3/16
[58] Field of Search ................... 330/13, 15, 22, 24, 330/30 D, 35, 40, 149

[56] References Cited

UNITED STATES PATENTS

| | | | |
|---|---|---|---|
| 3,493,881 | 2/1970 | Zuch | 330/35 X |
| 3,723,896 | 3/1973 | Flickinger | 330/32 D X |
| 3,828,230 | 8/1974 | Nishizawa et al. | 357/22 |
| 3,851,269 | 11/1974 | Szore | 330/149 X |
| 3,851,270 | 11/1974 | Vosteen | 330/35 X |
| 3,921,089 | 11/1975 | Tsurushima | 330/35 X |

Primary Examiner—James B. Mullins
Attorney, Agent, or Firm—Lewis H. Eslinger; Alvin Sinderbrand

[57] ABSTRACT

A transistor amplifier is comprised of a first differential amplifier for receiving an input signal and a second differential amplifier coupled to the output of the first differential amplifier. An output stage is coupled to the second differential amplifier and is comprised of a pair of complementary field effect transistors connected in push-pull configuration. Each of the field effect transistors has triode-type dynamic characteristics and is adapted to receive both a bias voltage and an amplified signal from the output of the second differential amplifier. Changes in the operating voltage supplied to the field effect transistors are injected into one of the differential amplifiers so as to effect a corresponding change in the bias voltage which is applied to the field effect transistors. This bias voltage change compensates for changes in the operating voltage so as to stabilize the field effect transistor drain currents at a constant value notwithstanding these operating voltage changes.

11 Claims, 4 Drawing Figures

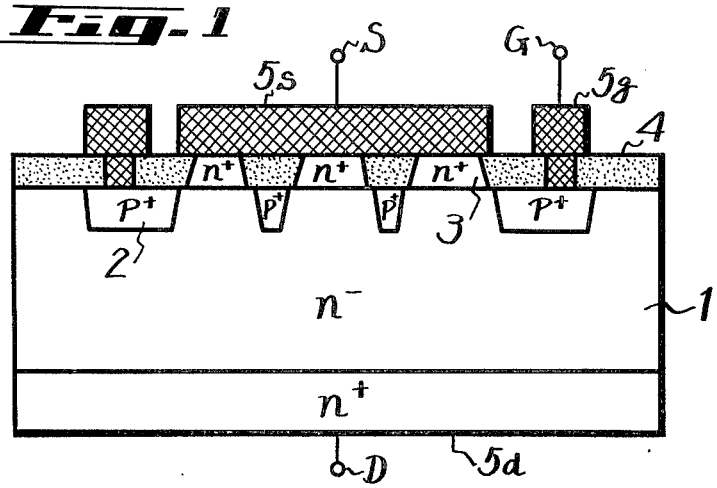
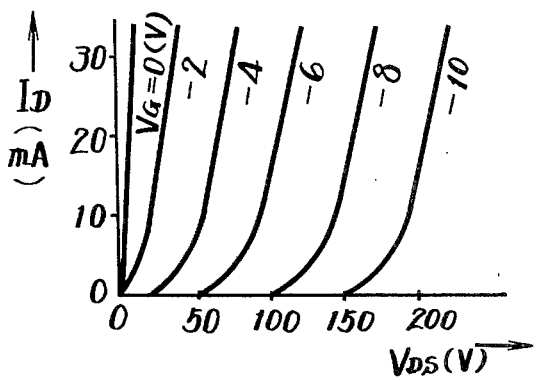
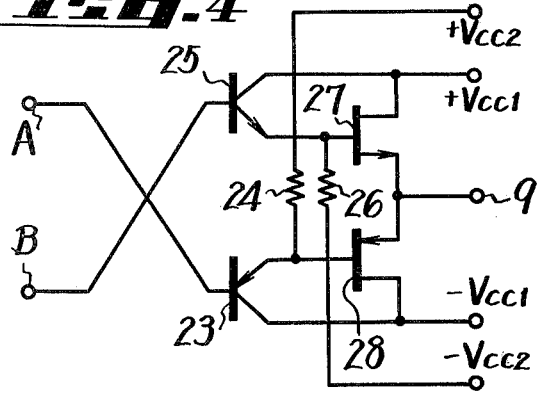
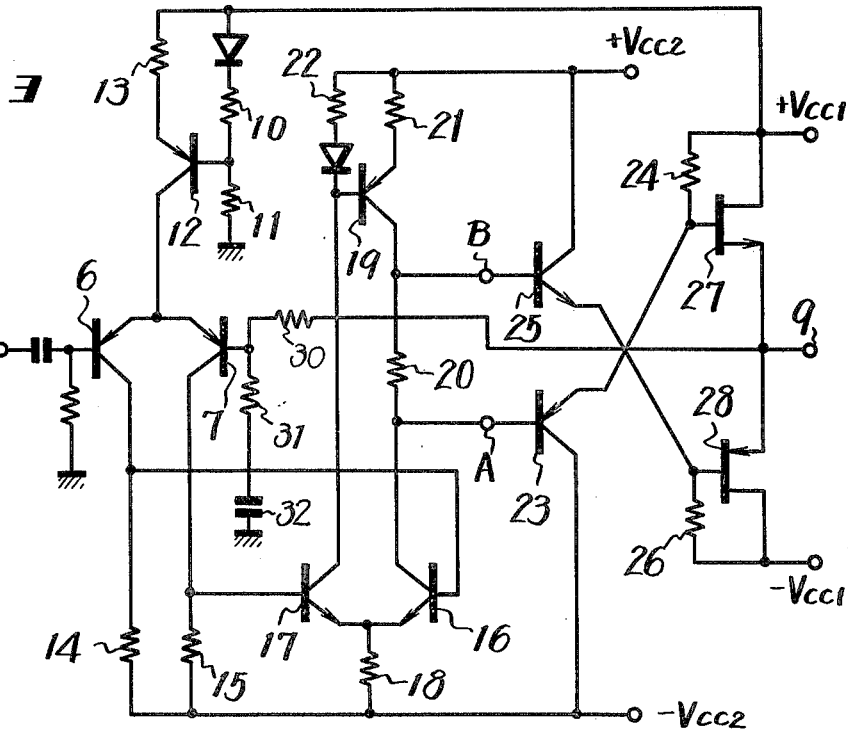

TRANSISTOR AMPLIFIER HAVING FIELD EFFECT TRANSISTORS WITH STABILIZED DRAIN BIAS CURRENT

BACKGROUND OF THE INVENTION

This invention relates to a transistor amplifier of the type having field effect transistors and, more particularly, to an amplifier wherein field effect transistors having triodetype dynamic characteristics are included in the output stage, and wherein the drain bias currents in these field effect transistors are stabilized, notwithstanding changes in the operating voltage applied to the output stage.

In the well-known type of field effect transistor (hereinafter FET) which heretofore has been used, the drain current flows in a lateral channel. That is, this channel generally is parallel to a major surface of the semiconductor substrate which forms the FET. Current flow through this channel is controlled by applying a reverse biased voltage between the gate and source electrodes. As this gate bias voltage magnitude increases, depletion layers are increased to constrict the channel so as to correspondingly limit the channel current. If the drain voltage increases, the drain current becomes saturated once this drain voltage attains a particular value. When the current-voltage relationship for the FET drain is graphically represented, the characteristic curves resemble the well-known pentode characteristics. The relationship between the drain current and the gate voltage is a second order relationship so that a graphical representation is the so-called square (or second order) characteristic.

Recently, a vertical channel FET has been developed wherein the current flows vertically, or longitudinally, through the semiconductor substrate. This is similar to the current flow in the well-known bipolar transistor. This vertical channel FET has the advantageous feature that its current utilization efficiency per unit area is high. When the current-voltage characteristics are considered, they resemble the characteristic curves of a conventional triode. Hence, this FET having triode-type dynamic characteristics has a very low output resistance. Other advantageous features are the avoidance of drain current saturation with an increase in drain voltage and superior voltage-current linearity. Because of these and additional features, the FET having triode-type dynamic characteristics finds ready application as an amplifier with high signal fidelity. One typical application thereof is in a power amplifier for audio signals. These features result in high quality sound reproduction of the type which heretofore had been thought to be achievable only by using a triode. In addition, the use of this type of FET is preferred over a triode because, in addition to the obvious advantages of solid state devices, the output resistance of the FET is much lower than that of the triode. In addition, the problem of deterioration of the thermionic emitter in a triode, resulting in impairment of the triode operation is avoided. Furthermore, this type of FET can be made with complementary characteristics, whereas complementary triodes are not available.

Accordingly, the FET having triode-type dynamic characteristics can be used in the output stage of a power amplifier. A pure complementary push-pull amplifier circuit can be readily constructed. Switching distortion, which is a significant problem in bipolar transistors, can be substantially reduced in this type of FET. Also, a wide and safe operating range is available to this FET, and it is capable of producing a much larger output than that produced by the bipolar transistor.

In one type of vertical channel FET, the semiconductor substrate, which forms the drain region, is provided with an overlying layer, the latter forming the source region. The source and drain regions are separated by a mesh-shape layer, which forms the gate region. With this structure, the output resistance of the FET is low and the drain current will not saturate even though the drain voltage may increase. Furthermore, this FET is relatively free of damaging current concentration. Also, there is a smaller susceptibility to damage caused by secondary yield, and its temperaure characteristic is negative. Additionally, this type of FET produces less heat during its operation and has high transient response speed so that it is readily adapted for switching operations. These characteristics indicate that this FET is a significant improvement in comparison with prior art bipolar transistors and is particularly adapted for use in a push-pull power amplifier circuit.

When used in an amplifier circuit, it has been found that the FET having triode-type dynamic characteristics is particularly sensitive to fluctuations in the operating voltages supplied thereto. That is, the drain bias current will vary as the power supply voltage varies. As a result thereof, distortion is introduced into the amplified signal produced by the FET. One type of push-pull power amplifier circuit which avoids this type of distortion is disclosed in copending U.S. Pat. application Ser. No. 508,836, filed Sept. 24, 1974, now U.S. Pat. No. 3,929,089, and assigned to the assignee of the instant invention.

While this earlier amplifier circuit is satisfactory for many applications, a problem may occur when the FET's which are used do not have identical parameters. That is, the FET parameters may vary from device to device, and in a random manner. Because of this, the DC bias current in the drain may not be fully compensated when the power supply is subjected to fluctuations. In particular, the voltage amplification factor $\mu$ and the pinch-off voltage $V_P$ of the FET may vary from one to another.

OBJECTS OF THE INVENTION

Therefore, it is an object of the present invention to provide a transistor amplifier using FET's having triode-type dynamic characteristics wherein the drain bias current is stabilized notwithstanding changes in the FET power supply.

Another object of this invention is to provide an amplifier having a DC bias circuit for an FET which exhibits triode-type dynamic characteristics, and wherein the DC bias circuit can accomodate FET's having different amplification factors and pinch-off voltages.

A further object of the present invention is to provide an amplifier wherein fluctuations in the operating voltage applied to an FET included in the amplifier are compensated, regardless of the particular values of the individual FET parameters.

Yet another object of this invention is to provide a bias control circuit for an FET which is based on the recognition that the amplification factor $\mu$ and the pinch-off voltage $V_P$ may vary from one FET to another, yet will maintain the relationship $V_P \cdot \mu =$ constant.

A still further object of the present invention is to provide an amplifier having FET's which exhibit triode-type dynamic characteristics in an output stage, wherein the drain bias current of each FET varies as a function of power supply fluctuations and the FET pinch-off voltage, and wherein such bias current variations are eliminated even though the pinch-off voltage may differ from one FET to another.

Various other objects, advantages and features will become apparent from the ensuing detailed description, and the novel features will be particularly pointed out in the appended claims.

SUMMARY OF THE INVENTION

In accordance with this invention, a transistor amplifier is provided with first and second differential amplifiers connected in cascade; an output stage connected to the second differential amplifier and comprised of a pair of complementary field effect transistors which receive both a bias voltage and an amplified signal from the differential amplifiers, each of these field effect transistors having triode-type dynamic characteristics; and wherein changes in the operating voltage supplied to the field effect transistors are injected into the cascaded differential amplifiers so as to correspondingly change the bias voltage applied to the field effect transistors, whereby drain bias currents in the field effect transistors are stabilized notwithstanding such operating voltage changes.

BRIEF DESCRIPTION OF THE DRAWINGS

The following detailed description, given by way of example, will best be understood in conjunction with the accompanying drawings in which:

FIG. 1 is a cross-sectional view showing one example of an FET having triode-type dynamic characteristics;

FIG. 2 is a graphical representation of the current-voltage characteristics for the FET shown in FIG. 1;

FIG. 3 is a schematic diagram illustrating one embodiment of an amplifier in accordance with the teachings of the present invention; and FIG. 4 is a schematic diagram illustrating another embodiment of a portion of the transistor amplifier in accordance with the teachings of the present invention.

DETAILED DESCRIPTION OF CERTAIN ONES OF THE PREFERRED EMBODIMENTS

Referring to the drawings, and in particular to FIG. 1, there is depicted a sectional view of one example of an FET having triode-type dynamic characteristics which may be used in a transistor amplifier. This FET is formed of a $n^-$ layer 1 which comprises a drain region and an overlying $n^+$ layer 3 which comprises a source region. The layer 3 may be formed by conventional selective oxidation techniques. Interposed between the drain region 1 and the source region 3 is a $p^+$ layer 2 which forms a gate region. This gate region is mesh-shaped and is electrically isolated from the source region 3 by an insulating layer 4. This insulating layer may comprise, for example, silicon dioxide. As shown, the gate region 2 is imbedded into the upper major surface of the drain region 1. The source region 3, as well as the gate region 2, are comprised of well over 1000 minute rectangular islands. The islands of the source region are electrically connected by a source electrode 5s. Since the gate region 2 is mesh-shaped, it is appreciated that these gate region islands are interconnected, and a gate electrode 5g extends through the insulating layer 4 so as to be connected to the mesh-shaped region, as shown. A drain electrode 5d of $n^+$ conductivity is provided on the lower major surface of the drain region 1. Finally, a source terminal S is connected to the source electrode 5s, a gate terminal G is connected to the gate electrode 5g and a drain terminal D is connected to the drain electrode 5d.

It is appreciated that, in the FET shown in FIG. 1, a current channel from the source region to the drain region flows in a substantially vertical direction. This channel is formed between adjacent portions of the mesh-shaped gate region 2. Since the maximum width of the channel is determined by the separation between adjacent portions of the gate region, the ratio between the channel length L and the channel width $h$ is small. Consequently, the output resistance of this vertical channel FET is low and the drain current will not saturate even with a continued increase in drain voltage. The relationship between the drain current and the drain-source voltage is graphically depicted in FIG. 2. As is apparent therefrom, these current-voltage characteristics are similar to the dynamic characteristics of a triode. Accordingly, the FET of FIG. 1 has triode-type dynamic characteristics.

As one numerical example, if the drain-source voltage ($V_{DS}$) of such an FET is equal to 20 volts and if the drain current ($I_D$) is equal to 1 amp, then the voltage amplification factor $\mu$ of the FET is 4, the output, or drain, resistance $r_D$ is 16 $\Omega$, and the mutual conductance gm of the FET is 250 millimohs. This FET has a low output impedance and is capable of providing a large output of excellent linearity and relatively low distortion. This, of course, is expected from the substantially large linear portions of the current-voltage characteristics.

If a suitable load is coupled to the FET, the mutual conductance gm becomes substantially constant and, accordingly, linear characteristics are obtained. Thus, when used in a push-pull amplifier, linear amplifications and minimum distortion are attained.

Since, in the embodiment of FIG. 1, the current channel is through the $n$-type drain region 1, the FET is of the so-called N-channel type. However, it will be apparent that a similar P-channel FET having triode-type dynamic characteristics may be produced by providing the drain region with $p^-$ conductivity, the gate region 2 with $n^+$ conductivity and the source region 3 with $p^+$ conductivity. Consequently, it is readily apparent that complementary FET's may be readily manufactured, each having triode-type dynamic characteristics.

Referring now to FIG. 3, there is illustrated a preferred embodiment of a transistor amplifier in accordance with the present invention. This amplifier is composed of a first differential amplifier formed of differentially-connected transistors 6 and 7 which are adapted to receive an input signal applied thereto. The output of this differential amplifier, which is a double-ended output signal, is supplied to a second differential amplifier formed of differentially-connected transistors 16 and 17. The output from this second differential amplifier, which is a single-ended output, is supplied to an output stage which is comprised of a pair of complementary FET's 27 and 28, connected in push-pull configuration, wherein each FET has triode-type dynamic characteristics.

In greater detail, the differentially-connected transistors 6 and 7 have their respective emitter electrodes connected in common and the base electrode of the transistor 6 is coupled to an input terminal 8 to receive an input signal. The base electrode of the transistor 7 is connected to a reference potential, such as ground, through a resistor 31 connected in series with a capacitor 32. The respective collector electrodes of these differentially-connected transistors are coupled through resistors 14 and 15 to a suitable power supply so as to receive an operating voltage from a source $-V_{cc2}$. A current source is connected to the common-connected emitter electrodes of these differentially-connected transistors. As shown, this current source is comprised of a transistor 12, which is of the same conductivity type as the transistors 6 and 7, whose base electrode is connected to a bias circuit so as to receive a substantially constant voltage. This bias circuit is formed of a series circuit comprised of a diode and resistors 10 and 11, as shown. This bias circuit is coupled to the power supply and is adapted to receive an operating voltage from a source $+V_{cc1}$. The junction defined by the resistors 10 and 11 is connected to the base electrode of the transistor 12. The emitter electrode of the transistor 12 is connected to the source $+V_{cc1}$ by an emitter resistor 13.

The collector electrodes of the transistors 6 and 7 are connected to the base electrodes of the differentially connected transistors 16 and 17 of the second differential amplifier so that this second differential amplifier is supplied with a double-ended amplified signal. The common-connected emitter electrodes of the transistors 16 and 17 are connected through an emitter resistor 18 to the source $-V_{cc2}$. As mentioned hereinabove, this second differential amplifier is adapted to produce a single-ended amplified signal in response to the double-ended signal applied thereto. Accordingly, the collector electrode of the transistor 16 is coupled through a load resistor 20 and then through a current source to the power supply so as to receive an operating voltage from a source $+V_{cc2}$. The collector electrode of the transistor 17 is connected directly to a portion of this current source and is adapted to receive a substantially constant voltage and, as is shown, is not provided with a load resistor. This current source includes a transistor 19 whose emitter-collector circuit is connected in series with the load resistor 20. The emitter electrode of the transistor 19 is coupled through an emitter resistor 21 to the source $+V_{cc2}$, and the base electrode of the transistor is supplied with a constant voltage from the source $+V_{cc2}$ by a resistor 22 connected in series with a diode. The base electrode of the transistor 19, which is supplied with this constant voltage, additionally is connected to the collector electrode of the transistor 17. In addition to serving as a current source, the transistor 19 functions to convert the double-ended signal normally produced by the differentially-connected transistors 16 and 17 into a single-ended signal which appears across the load resistor 20.

In the illustrated embodiment, the transistor 19 is of an opposite conductivity type than the differentially-connected transistors 16 and 17. The diode in the base circuit of the transistor 19 is poled in the same direction as the emitter-base conducting path.

The opposite terminals A and B of the resistor 20 are coupled to the output stage of the amplifier by emitter-follower devices. In particular, an emitter-follower formed of the transistor 23 serves to couple the resistor terminal A to the gate electrode of the FET 27. To this effect, the collector electrode of the transistor 23 is connected directly to the source $-V_{cc2}$ and the emitter electrode of the transistor 23 is coupled through an emitter resistor 24 to the source $+V_{cc1}$. In a similar manner, the resistor terminal B is coupled through the emitter-follower transistor 25 to the gate electrode of the FET 28. Hence, the collector electrode of the transistor 25 is connected directly to the source $+V_{cc2}$ and the emitter electrode of this transistor is coupled through an emitter resistor 26 to the power supply so as to receive an operating voltage provided by the source $-V_{cc1}$. The FET's 27 and 28 are complementary, and the FET 27 is an N-channel device, while the FET 28 is a P-channel device. The respective source electrodes of these FET's are connected in common and to an output terminal 9. In addition, the signal provided at the output terminal 9 is fed back through a resistor 30 to the base electrode of the transistor 7 included in the first differential amplifier. The operating voltages supplied to the FET's 27 and 28 are derived from the sources $+V_{cc1}$ and $-V_{cc1}$, respectively.

It is appreciated that the sources $+V_{cc1}$ and $-V_{cc1}$ may be constituted by the positive and negative terminals, respectively, of a first source or a first power supply. Similarly, the sources $+V_{cc2}$ and $-V_{cc2}$ may be constituted merely by the positive and negative terminals of a second source of power supply. In any event, the operating voltages applied to the output stage, that is, the operating voltages applied to the FET's 27 and 28, may be susceptible to voltage fluctuations. In accordance with a feature of the present invention, these voltage fluctuations in the operating voltage applied to the output stage are injected through the current source connected to the first differential amplifier so as to cause a corresponding change in the bias voltages appearing across the resistor 20 and at the terminals A and B. It is known that when the drain voltage applied to the FET having triode-type dynamic characteristics varies by an amount $\Delta V$, the drain bias current changes in the same direction. That is, if $\Delta V$ is positive, the drain current is increased. Conversely, if $\Delta V$ is negative, the drain current is decreased. By varying the bias voltages across the resistor 20 as a function of the voltage fluctuations in the sources $\pm V_{cc1}$, the gate voltage can be compensated for drain voltage changes $\Delta V$ so as to restore the drain current to its constant value. This is achieved by injecting the operating voltage changes $\Delta V$ through the current source including the transistor 12 to the common-connected emitter electrode of the transistors 6 and 7, thereby to vary their respective base-emitter voltages. This base-emitter voltage change is amplified by the first and second differential amplifiers and is applied across the resistor 20 to the bias terminals A and B so as to effect the necessary change in the FET gate bias voltages.

The foregoing operation now will be particularly explained. Assuming that the double-ended signals applied to the differentially-connected transistors 16 and 17 have the same phase relation, the gain of the second differential amplifier may be closely approximated by $R_{20}/R_{18}$, where $R_{18}$ is the resistance value of the resistor 18 and $R_{20}$ is the resistance value of the resistor 20. Also, if the resistance values of the resistors 14 and 15 are equal, and is represented by $R_{14}$, then the operating voltage change $\Delta V$ which is injected through the current source transistor 12 and is amplified by the first and second differential amplifiers to appear at the resistor 20 is subjected to a total gain G which can be expressed as follows:

$$G = \frac{R_{10}}{R_{10}+R_{11}} \cdot \frac{R_{14}}{R_{13}} \cdot \frac{R_{20}}{R_{18}} \quad (1)$$

In equation (1), $R_{10}$, $R_{11}$ and $R_{13}$ represent the resistance values of the resistors 10, 11 and 13, respectively. From this equation, it is appreciated that the operating voltage change which is injected into the emitter electrodes of the differentially-connected transistors 6 and 7 results in an equal voltage change across the resistors 14 and 15. Hence, this change is applied in the same phase relation to the differentially-connected transistors 16 and 17, resulting in a variation in the bias voltage across the resistor 20.

In general, the change in the FET gate voltage which is necessary to restore the drain bias current to its constant value is not equal to the operating voltage change $\Delta V$. Rather, this gate voltage change need merely be $(1/\mu)\Delta V$, where $\mu$ is the amplification factor of the FET. Since the FET's 27 and 28 are of complementary construction, it is appreciated that the bias voltages at the terminals A and B should be of opposite polarities with respect to each other. Thus, to compensate for an operating voltage fluctuation $\Delta V$, the change in the bias voltage at the terminal B should be $+(1/\mu)\Delta V$ and the change in the bias voltage at the terminal A should be $-(1/\mu)\Delta V$. Consequently, the total change in the bias voltage across the resistor 20 should be $(2/\mu)\Delta V$. This means that the total gain G to which the operating voltage fluctuation should be subjected is:

$$G = (2/\mu) \quad (2)$$

It will be assumed that the bias voltage normally applied to each of the terminals A and B is equal to the pinch-off voltage $V_P$ of the FET's 27 and 28, respectively. This is a valid assumption when it is recognized that the FET's are biased for class-B push-pull operation, and the base-emitter voltage drops of the emitter-follower transistors 23 and 25 are neglected. Now, if the current produced by the current source transistor 19 is I, then the resistor 20 will have the resistance value $R_{20}$ as follows:

$$R_{20} = (2V_P/I) \quad (3)$$

Equations (1), (2) and (3) can be combined to obtain:

$$G = \frac{2}{\mu} = \frac{R_{10}}{R_{10}+R_{11}} \cdot \frac{R_{14}}{R_{13}} \cdot \frac{1}{R_{18}} \cdot \frac{2V_P}{I} \quad (4)$$

It is possible that the pinch-off voltage $V_p$ may vary from one FET to another. However, even under this circumstance, the pinch-off voltage $V_P$ and the voltage amplification factor $\mu$ for such FET's are inversely related in a constant manner, whereby:

$$V_P \cdot \mu = k \quad (5)$$

In equation (5), $k$ is a constant value to express this relationship.

Equation (5) can be used to express the first term in equation (4) as follows:

$$(2/\mu) = (2V_P/k) \quad (6)$$

By combining equations (4) and (6), the following obtains:

$$\frac{2V_P}{k} = \frac{R_{10}}{R_{10}+R_{11}} \cdot \frac{R_{14}}{R_{13}} \cdot \frac{1}{R_{18}} \cdot \frac{2V_P}{I} \quad (7)$$

The terms of equation (7) can be rearranged as:

$$k = \frac{I \cdot R_{13} \cdot R_{18} (R_{10}+R_{11})}{R_{10} \cdot R_{14}} \quad (8)$$

Therefore, if the resistance values of any one or more of the resistors 13, 14 and 18 are varied so as to satisfy equation (8), the gate bias voltage of the FET's 27 and 28 can be adjusted to compensate for operating voltage fluctuations $\Delta V$ and, moreover, this compensation can be effected without regard to the specific pinch-off voltage value or voltage amplification factor of the individual FET. Thus, the circuit illustrated in FIG. 3 and defined by the equation (8) will stabilize the drain bias current for the FET's even though the particular parameters of each FET may vary from one circuit to another. Such parameter differences can be easily taken into account if one or more of the resistors 13, 14 and 18 is variable, such as a potentiometer. Of course, if the resistor 14 is made variable, the resistor 15 likewise should be variable in the same amount. Still further, and as an alternative, one or more of the resistors 10 and 11 can be a variable resistor to satisfy equation (8).

An alternative embodiment of the output stage in the amplifier circuit of FIG. 3 is schematically depicted in FIG. 4, wherein like component parts are identified by like reference numerals. The embodiment of FIG. 4 operates in substantially the same manner as the embodiment previously described with respect to FIG. 3. Hence, in this alternative embodiment, the collector electrode of the emitter-follower transistor 23 is connected to the source $-V_{cc1}$ and the emitter resistor 24 connects the emitter electrode of the transistor 23 to the source $+V_{cc2}$; and since the collector electrode of the emitter-follower transistor 25 is connected to the source $+V_{cc1}$ and the emitter resistor 26 couples the emitter electrode of the transistor 25 to the source $-V_{cc2}$, and if the operating voltage $V_{cc2}$ is greater than the operating voltage $V_{cc1}$, then the FET's 27 and 28 can be driven at a greater amplitude. As a further alternative, not shown, the emitter-follower transistors 23 and 25 can be omitted, whereby the terminals A and B of the resistor 20 are connected directly to the gate electrodes of the FET's 27 and 28, respectively.

Depending upon the operating point for the FET's, the voltage amplification factor $\mu$ might be changed accordingly. Nevertheless, this shift in the value of $\mu$ can be compensated merely by changing the resistance value of the resistor 10. Such change in the resistance value is readily effected if the resistor 10 comprises, for example, a potentiometer. In addition, a Zener diode can be connected in series with this resistor.

While the present invention has been particularly shown and described with reference to certain preferred embodiments therof, it should be readily appreciated that various changes and modifications in form and details can be made without departing from the spirit and scope of the invention. It is, therefore, intended that the appended claims be interpreted as including all such changes and modifications.

What is claimed is:
1. A transistor amplifier comprising:
a first differential amplifier for receiving an input signal:
a second differential amplifier coupled to said first differential amplifier for receiving the signal amplified by said first differential amplifier;
an output stage comprised of a pair of complementary field effect transistors coupled to said second differential amplifier for receiving a bias voltage and the signal amplified by said second differential amplifier and for applying the amplified signal to an output terminal, each of said field effect transistors having triode-type dynamic characteristics and each field effect transistor having a particular amplification factor $\mu$ and a particular pinch-off voltage $V_P$, wherein $\mu \cdot V_P$ of each said field effect transistor is a constant $k$, each of said field effect transistors having a drain bias current subject to fluctuations when an operating voltage applied thereto changes;
means for supplying operating voltages to said first and second differential amplifiers and said output stage; and
means for injecting changes in the operating voltage supplied to at least said output stage into one of said differential amplifiers to correspondingly change said bias voltage applied to said field effect transistors in accordance with said operating voltage changes, whereby the bias currents in said field effect transistors are stabilized notwithstanding said operating voltage changes.

2. A transistor amplifier in accordance with claim 1 wherein said complementary field effect transistors are connected in push-pull configuration; and wherein said means for injecting operating voltage changes is coupled to said first differential amplifier.

3. A transistor amplifier in accordance with claim 2 wherein said first differential amplifier is comprised of differentially-connected transistors and said means for injecting operating voltage changes comprises current source means coupled to the common-connected emitters of said differentially-connected transistors and responsive to said operating voltage changes for changing the current in said differentially-connected transistors.

4. A transistor amplifier in accordance with claim 2 wherein said first differential amplifier comprises a double-ended output differential amplifier and said second differential amplifier comprises a single ended output differential amplifier including a load resistor and a current source coupled to said load resistor, such that respective bias voltages are produced across said load resistor and applied to said complementary field effect transistors.

5. A transistor amplifier in accordance with claim 4 wherein said second differential amplifier comprises differentially-connected transistors; said load resistor being connected to the collector electrode of one of said differentially-connected transistors; and said current source comprises an additional transistor having its collector-emitter circuit connected in series with said load resistor and means for supplying said operating voltage to said second differential amplifier, and its base circuit coupled to the collector electrode of the other of said differentially-connected transistors.

6. A transistor amplifier in accordance with claim 2 wherein said first differential amplifier comprises first and second differentially-connected transistors having their collector electrodes connected to first and second resistors, respectively, and their base electrodes connected to receive said input signal; said means for injecting operating voltage changes comprises a third transistor connected as a current source to the common-connected emitter electrodes of said first and second transistors and having its emitter electrode coupled through a third resistor to said means for supplying the operating voltage to said output stage, and its base electrode coupled to a bias circuit including fourth and fifth resistors connected in series to said means for supplying the operating voltage to said output stage; and said second differential amplifier comprises fourth and fifth differentially connected transistors having their base electrodes coupled to the collector electrodes of said first and second transistors, respectively, their common-connected emitter electrodes coupled through a sixth resistor to said means for supplying the operating voltage to said second differential amplifier, and the collector electrode of one of said fourth and fifth transistors connected to a seventh resistor and a current source for supplying single-ended amplified signals to said complementary field effect transistors.

7. A transistor amplifier in accordance with claim 6, further comprising first means for coupling one terminal of said seventh resistor to the gate electrode of one of said field effect transistors for applying at least said bias voltage thereto; and second means for coupling the other terminal of said seventh resistor to the gate electrode of the other of said field effect transistor for applying at least a bias voltage thereto.

8. A transistor amplifier in accordance with claim 7 wherein the resistance values of said first through seventh resistors is $R_1$, $R_2$, $R_3$, $R_4$, $R_5$, $R_6$ and $R_7$, respectively, said resistance values being related to the amplification factor of one of said field effect transistors in accordance with $$\frac{R_5}{R_4+R_5} \times \frac{R_1}{R_3} \times \frac{R_7}{R_6} = \frac{2}{\mu}.$$

9. A transistor amplifier in accordance with claim 7 wherein the bias current flowing through said seventh resistor is $I$ and the resistance values of said first through sixth resistors is $R_1$, $R_2$, $R_3$, $R_4$, $R_5$ and $R_6$, respectively, said resistance values, current and constant $k$ being related in accordance with $$k = \frac{I \cdot R_3 \cdot R_6 (R_4+R_5)}{R_1 \cdot R_4}.$$

10. A transistor amplifier in accordance with claim 7 wherein said first and second coupling means comprise first and second emitter-follower transistors, respectively.

11. A transistor amplifier in accordance with claim 10 wherein each emitter-follower transistor has its collector electrode connected to one of the means for supplying operating voltages and its emitter electrode coupled to another of the means for supplying operating voltages.

* * * * *